(12) United States Patent
Gumann et al.

(10) Patent No.: US 10,811,748 B2
(45) Date of Patent: Oct. 20, 2020

(54) CRYOGENIC ON-CHIP MICROWAVE FILTER FOR QUANTUM DEVICES

(71) Applicant: International Business Machines Corporation, Armonk, NY (US)

(72) Inventors: Patryk Gumann, Tarrytown, NY (US); Salvatore B. Olivadese, Stamford, CT (US); Markus Brink, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 107 days.

(21) Appl. No.: 16/135,703

(22) Filed: Sep. 19, 2018

(65) Prior Publication Data

US 2020/0090078 A1 Mar. 19, 2020

(51) Int. Cl.
*H01P 1/203* (2006.01)
*G06N 10/00* (2019.01)
(Continued)

(52) U.S. Cl.
CPC ......... *H01P 1/20327* (2013.01); *G06N 10/00* (2019.01); *H01L 23/345* (2013.01);
(Continued)

(58) Field of Classification Search
CPC .... H01P 3/08; H01P 1/30; H01P 1/203; H01P 1/20327; G06N 10/00
(Continued)

(56) References Cited

U.S. PATENT DOCUMENTS 5,838,213 A * 11/1998 Huang .................... H01P 1/201
                                                              333/99 S
6,094,588 A    7/2000 Adam
(Continued)

FOREIGN PATENT DOCUMENTS

EP           12653141 A1    12/2002

OTHER PUBLICATIONS

PCT, International Searching Authority, PCT/EP2019/073492, Oct. 29, 2019.
(Continued)

*Primary Examiner* — Rakesh B Patel
(74) *Attorney, Agent, or Firm* — Garg Law Firm, PLLC; Rakesh Garg; Keivan Razavi

(57) ABSTRACT

An on-chip microwave filter circuit includes a substrate formed of a first material that exhibits at least a threshold level of thermal conductivity, wherein the threshold level of thermal conductivity is achieved at a cryogenic temperature range in which a quantum computing circuit operates. The filter circuit further includes a dispersive component configured to filter a plurality of frequencies in an input signal, the dispersive component including a first transmission line disposed on the substrate, the first transmission line being formed of a second material that exhibits at least a second threshold level of thermal conductivity, wherein the second threshold level of thermal conductivity is achieved at a cryogenic temperature range in which a quantum computing circuit operates. The dispersive component further includes a second transmission line disposed on the substrate, the second transmission line being formed of the second material.

19 Claims, 6 Drawing Sheets

(51) Int. Cl.
  *H01P 11/00* (2006.01)
  *H01L 23/34* (2006.01)
  *H01P 1/20* (2006.01)
  *H01R 13/66* (2006.01)
  *H04B 3/56* (2006.01)

(52) U.S. Cl.
  CPC .............. *H01P 1/20* (2013.01); *H01P 11/003* (2013.01); *H01R 13/66* (2013.01); *H04B 3/56* (2013.01)

(58) Field of Classification Search
  USPC ................................................. 333/204, 238
  See application file for complete search history.

(56) References Cited

U.S. PATENT DOCUMENTS

| 6,867,665 | B2 | 3/2005 | Manku |
| 7,199,443 | B2 | 4/2007 | Elsharawy |
| 7,224,242 | B2 | 5/2007 | Taylor |
| 9,270,071 | B2 | 2/2016 | Abraham |

OTHER PUBLICATIONS

Zou et al., "High-Quality Factor Superconducting Flexible Resonators Embedded in Thin-Film Polyimide HD-4110", IEEE Transactions on Applied Superconductivity., vol. 27, No. 7, Oct. 2017, pp. 1-5, XP055632900, US ISSN: 1051-8223, DOI: 10.1109/TASC.2017.2732281.

Talisa et al., "Low- and High-Temperature Superconducting Microwave Filters", IEEE Transactions on Microwave Theory and Techniques, Plenum, USA, vol. 39, No. 9, Sep. 1991, pp. 1448-1454, XP000219212 ISSN: 0018-9480, DOI: 10.1109/22.83816 Section II.

Fukushima et al., "Attenuation of Microwave Filters for Single-Electron Tunneling Experiments", IEEE, 1997 (see p. 289).

* cited by examiner

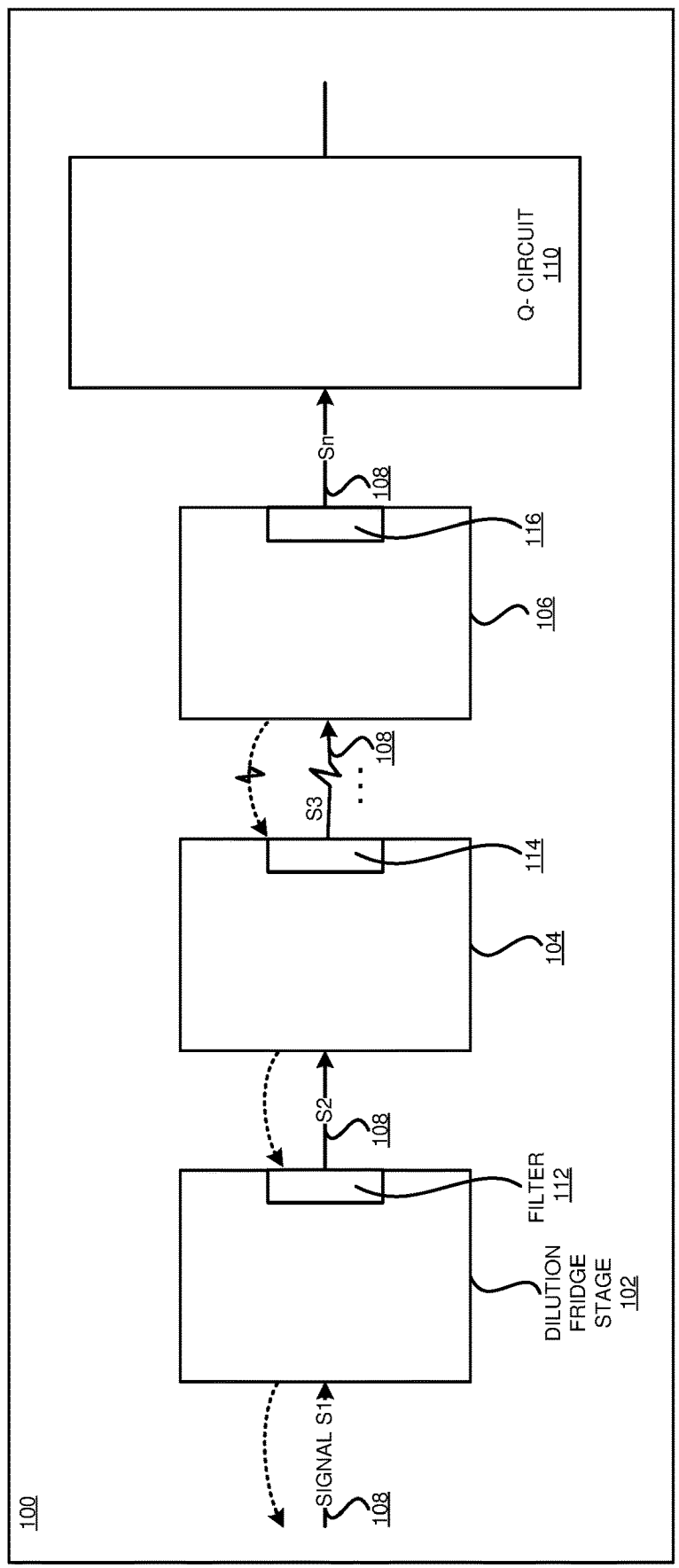

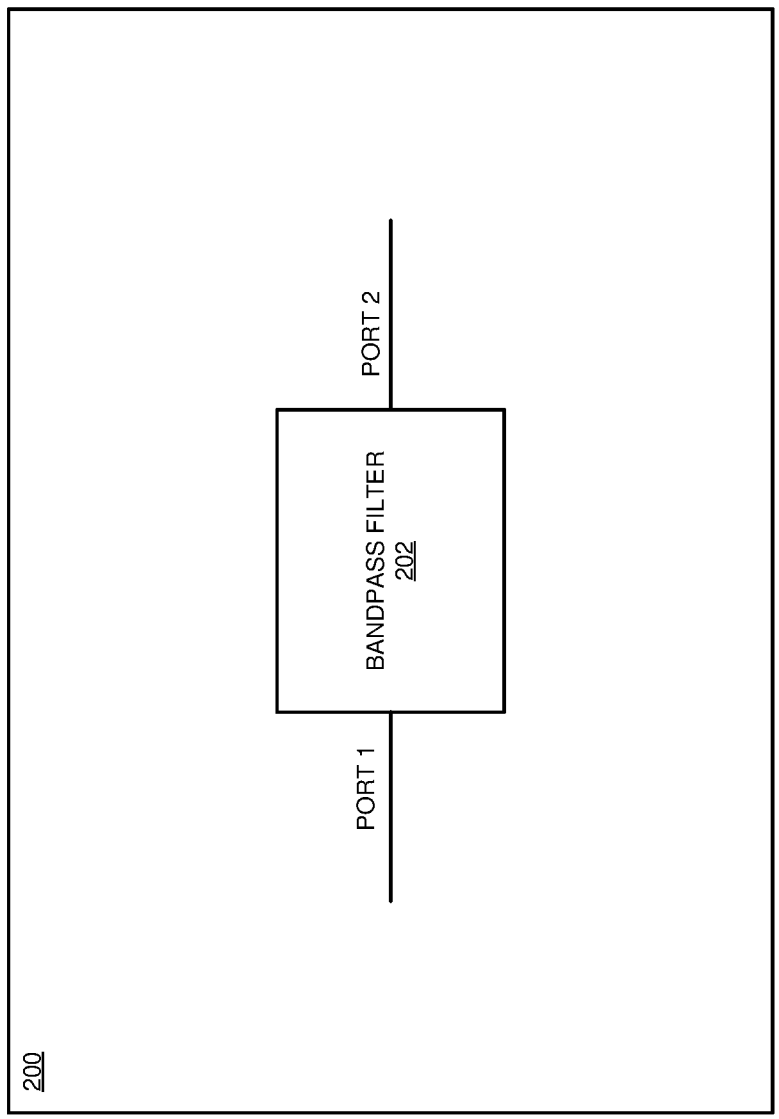

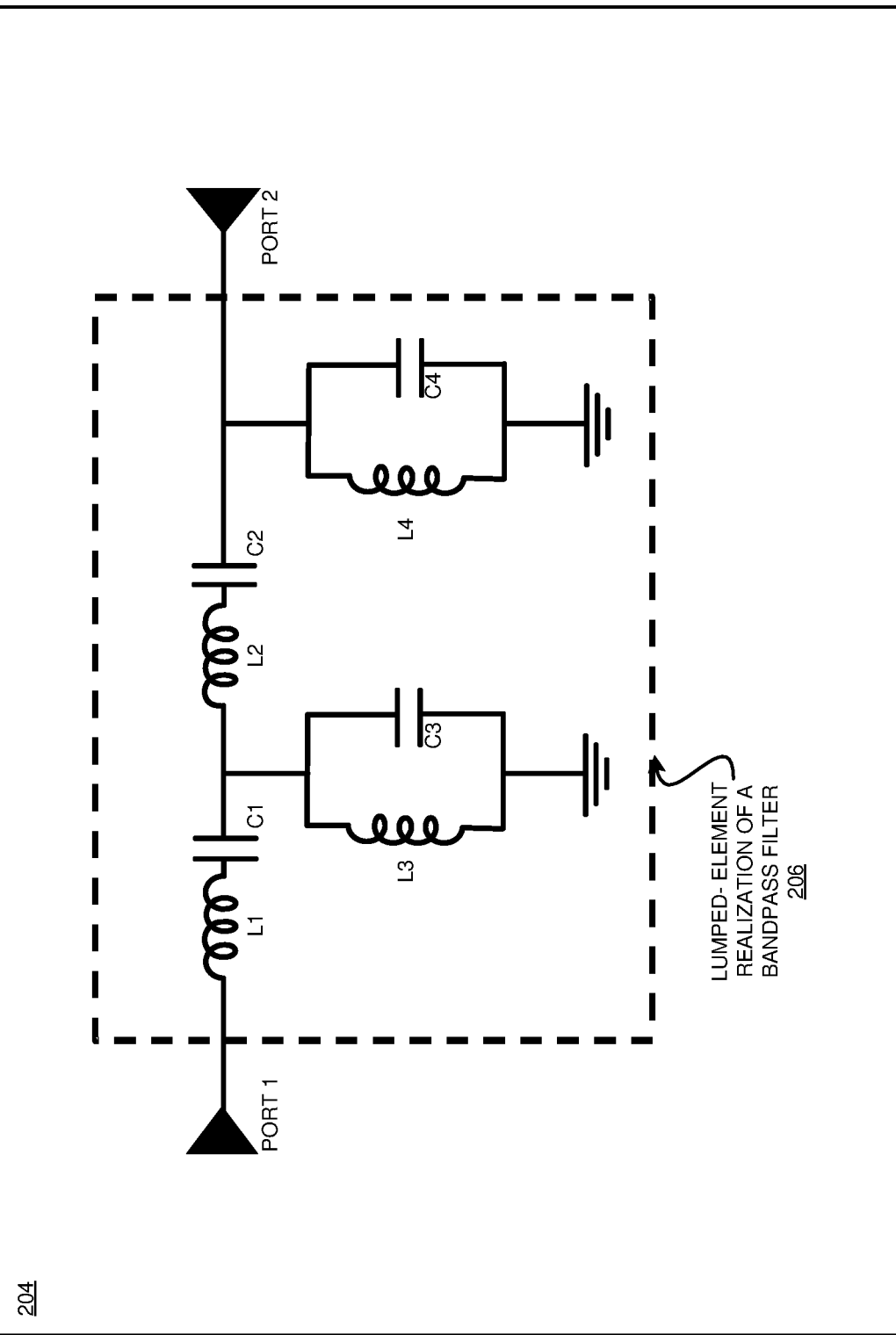

CRYOGENIC ON-CHIP MICROWAVE FILTER FOR QUANTUM DEVICES

TECHNICAL FIELD

The present invention relates generally to a device, a circuit design method, and a circuit construction system for a microwave filter usable with superconducting qubits in quantum computing. More particularly, the present invention relates to a device, method, and system for a cryogenic on-chip microwave filter for quantum devices.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature —pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states —|0> and |1>. These two states may be two energy states of atoms, for example, the ground (|g>) and first excited state (|e>) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits (q-circuits), e.g., the qubits themselves, the readout circuitry associated with the qubits, and other parts of the quantum processor, must not alter the energy states of the qubit, such as by injecting or dissipating energy in any significant manner, or influence the relative phase between the |0> and |1> states of the qubit. This operational constraint on any circuit that operates with quantum information necessitates special considerations in fabricating semiconductor and superconducting structures that are used in such circuits.

The presently available superconducting quantum circuits are formed using materials that become superconducting at cryogenically low temperatures, e.g., at about 10-100 millikelvin (mK), or about 4 K. The electronic circuits that are used to control, operate, and measure the quantum circuits are usually located outside the dilution fridge that houses the superconducting quantum circuit. The temperature outside the fridge is usually about 300 K (room temperature).

The presently available superconducting quantum circuits usually operate in the microwave frequency range. Microwave signals/pulses are used to initialize, manipulate, control, and measure the superconducting qubits within the superconducting q-circuits. To communicate these microwave signals between the external electronic circuits outside the fridge and the superconducting quantum circuits inside the fridge, microwave transmission lines are used inside the dilution fridge. Coaxial lines are one example of transmission lines that can carry these microwave signals.

The presently available dilution fridges are cryogenic apparatus which can be used to cool down samples/devices to millikelvin temperatures. However, the transition from room temperature to millikelvin temperatures inside the fridge is not sudden or abrupt. To facilitate the temperature transition and the cooling operation, the dilution fridge consists of multiple thermally-isolated stages (compactly referred to herein as "stage", plural "stages") held at different ambient temperatures. For example, common commercial dilution fridges have 5 temperature-stages inside the fridge 40 K, 4 K, 0.7 K, 0.1 K, 0.01 K (also known as the base stage). To simplify the discussion, we focus below on the input lines inside the fridge. To maintain the temperature difference between the different stages inside the fridge and to protect the quantum circuits from noise coming down the input lines, which originates from room-temperature electronics or blackbody radiation of higher stages or other sources of electromagnetic noise, it is common practice to use lossy transmission lines to connect between two consecutive stages and to incorporate resistive attenuators and filters in the path of these lines at the different stages. In general, components serve multiple purposes: they filter/reduce the noise coming down these input lines, they filter/reduce microwave signals propagating in the lines, they provide thermal isolation between the stages, and they cool down the microwave signals propagating through them.

A signal propagating on a line between stages can contain hot electrons, electrons containing more energy as a result of being located outside the fridges at room temperature. Hot electrons can bring thermal noise into the stages. This noise can be in the infrared spectrum.

A signal propagating on a line passing through a stage can contain noise, especially electromagnetic noise. This noise can be in the microwave frequency spectrum or infrared spectrum. For the reasons described herein, electronic, microwave and infrared noise are undesirable when the lines and signals relate to quantum computing using q-circuits.

Filtration of a signal is the process of reducing the power of the signal at a particular frequency or frequency-range. A filter is an electronic circuit with two ports that is configured to filter an input signal/noise at a particular frequency or frequency-range.

A dispersive filter filters the transmitted signal/noise through its two ports by reflecting a portion of its energy/power off the port it entered through.

The illustrative embodiments recognize that commercially available standard microwave filters are not designed to operate in the cryogenic temperature range, lower than about 77 K down to about 0.01 K. For example, in most cases, the transmission line materials used for these filters have far from ideal thermal conductance. The illustrative embodiments also recognize that physical connections between a filter substrate, signal lines, and filter housing promote removal of thermal energy in the signal lines. Furthermore, the illustrative embodiments recognize certain disadvantages with the presently available microwave filters. For example, in most cases, the presently available microwave filters are formed such that a metallic case enclosing the substrate is stainless steel, which has poor thermal conductance. Additionally, the connectors located on either port of the microwave filter are not standardized from one microwave filter to the next, which increases reflections of signals in the line, which, in turn, can cause distortions in the microwave pulses/signals, crosstalk, and ripples in the measured signals. In addition, the substrate materials used for these filters have far from ideal thermal conductance.

SUMMARY

The illustrative embodiments provide an electronic attenuating device, and a method and system of fabrication therefore. In one embodiment, an on-chip microwave filter circuit includes a substrate formed of a first material that exhibits at least a threshold level of thermal conductivity, wherein the threshold level of thermal conductivity is achieved at a cryogenic temperature range in which a quantum computing circuit operates. The filter circuit of the embodiment further includes a dispersive component configured to filter a plurality of frequencies in an input signal, the dispersive component including a first transmission line disposed on the substrate, the first transmission line being formed of a second material that exhibits at least a second threshold level of thermal conductivity, wherein the second threshold level of thermal conductivity is achieved at a cryogenic temperature range in which a quantum computing circuit operates. The dispersive component of the filter circuit of the embodiment further includes a second transmission line disposed on the substrate, the second transmission line being formed of the second material.

In another embodiment, an on-chip microwave filter circuit includes a connector coupled to the first transmission line, the connector being formed of a third material that exhibits at least a third threshold level of thermal conductivity, wherein the third threshold level of thermal conductivity is achieved at a cryogenic temperature range in which a quantum computing circuit operates.

In another embodiment, the filter circuit includes a second connector coupled to the second transmission line, the second connector being formed of the third material.

In another embodiment, the filter circuit includes a housing coupled to the substrate, the housing being formed of a fourth material that exhibits at least a fourth threshold level of thermal conductivity, wherein the fourth threshold level of thermal conductivity is achieved at a cryogenic temperature range in which a quantum computing circuit operates.

In another embodiment, the dispersive component of the filter circuit includes a third transmission line disposed on the substrate, the third transmission line being formed of the second material.

In another embodiment, the third transmission line is disposed on the substrate between the first transmission line and the second transmission line.

In another embodiment, the third transmission line is spaced apart on the substrate from the first transmission line.

In another embodiment, the first transmission line has a thickness of about 10 nm to 1000 nm.

In another embodiment, the first transmission line has a width of about 0.5 mm.

An embodiment includes a fabrication method for fabricating the on-chip microwave filter circuit.

An embodiment includes a system for fabricating the on-chip microwave filter circuit.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 1 depicts a block diagram of an example configuration of an input line conditioning for quantum computing devices in accordance with an illustrative embodiment;

FIG. 2A depicts an example configuration of an on-chip microwave filter in accordance with an illustrative embodiment;

FIG. 2B depicts an example circuit implementing an on-chip microwave filter in accordance with an illustrative embodiment;

DETAILED DESCRIPTION

Figure 3:
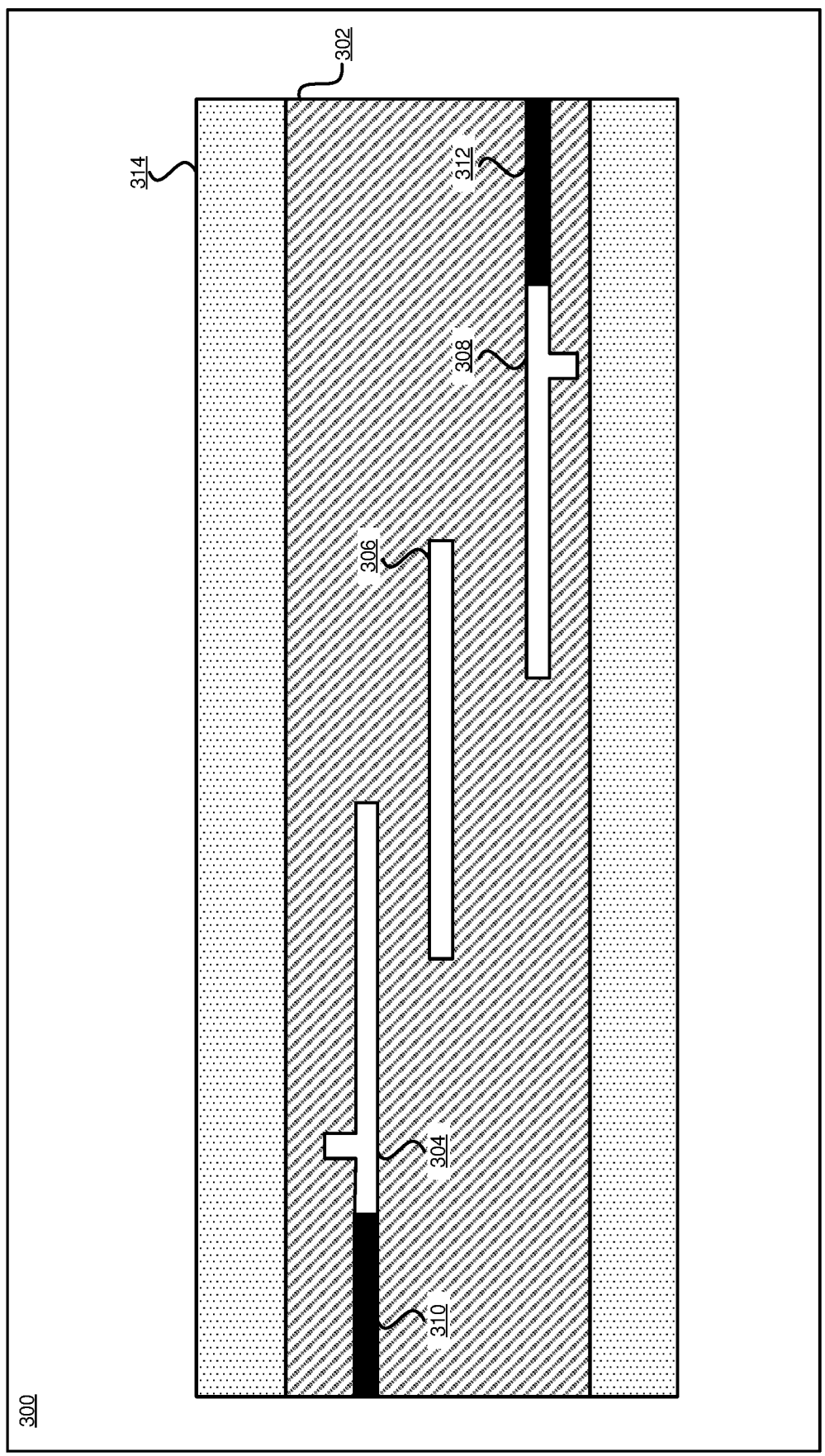
FIG. 3 depicts an example on-chip microwave filter 300 in accordance with an illustrative embodiment.

The illustrative embodiments used to describe the invention generally address and solve the above-described needs for attenuating certain microwave signals mainly in the input lines connecting to q-circuits. The illustrative embodiments provide on-chip microwave filters for quantum circuits, which address the above-described need or problem.

An operation described herein as occurring with respect to a frequency of frequencies should be interpreted as occurring with respect to a signal of that frequency or frequencies. All references to a "signal" are references to a microwave signal unless expressly distinguished where used.

The illustrative embodiments recognize that performance of any superconducting based quantum architecture is heavily dependent on the quality of the superconducting qubits themselves which can be directly characterized by the measuring coherence times. These times strongly depend on the performance of microwave hardware—not only the qubits themselves but also the filters used in the microwave lines and the housing for the filters—at temperature range where quantum computing circuits operate. In order to increase the coherence times, thus improve the functionality of the quantum processors, all the microwave components, control lines, components, and packaging are thermalized to a quantum computing-acceptable level of thermalization.

The illustrative embodiments allow for better thermalization of the microwave components and cleaner microwave signal throughput, by utilizing a filter design and high thermal conductivity materials in the fabrication of the filter and the housing, as described herein. The illustrative embodiments recognize that physical connections between a filter substrate, housing, and signal lines promote removal of thermal energy from the signal lines.

An embodiment provides a configuration of an on-chip microwave filter that operates at cryogenic temperatures. Another embodiment provides a design/construction method for the on-chip microwave filter, such that the method can be implemented as a software application. The application implementing a design/construction method embodiment can be configured to operate in conjunction with an existing circuit manufacturing system—such as a circuit assembly system.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example resistors, inductors, capacitors, and other circuit components are used in the figures and the illustrative embodiments. In an actual circuit, additional structures or component that are not shown or described herein, or structures or components different from those shown but for a similar function as described herein may be present without departing the scope of the illustrative embodiments.

Furthermore, the illustrative embodiments are described with respect to specific actual or hypothetical components only as examples. The steps described by the various illustrative embodiments can be adapted for fabricating a circuit using a variety of components that can be purposed or repurposed to provide a described function within an on-chip microwave filter, and such adaptations are contemplated within the scope of the illustrative embodiments.

The illustrative embodiments are described with respect to certain types of materials, electrical properties, steps, numerosity, frequencies, circuits, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a block diagram of an example configuration of an input line conditioning for quantum computing devices in accordance with an illustrative embodiment. Configuration 100 comprises a set of one or more dilution fridge stages 102, 104, . . . 106. Input line 108 connects an external circuit to q-circuit 110. Assuming that line 108 carries a microwave signal to q-circuit 110, signal $S_1$ is a signal which includes microwave noise that is to be filtered along with the signal $S_1$. Signal $S_n$ is the filtered signal that reaches q-circuit 110.

One embodiment configures an on-chip microwave filter with some but not all of stages 102-106. Another embodiment configures an on-chip microwave filter with each of stages 102-106, as shown in FIG. 1. For example, on-chip microwave filter 112 is configured to operate with stage 102. On-chip microwave filter 112 receives input signal $S_1$ and reflected signal $S_{R2}$ from subsequent stages in the series of stages. On-chip microwave filter 112 filters one frequency or frequency band from the $(S_1+S_{R2})$ signal to produce signal $S_2$.

On-chip microwave filter 114 is configured to operate with stage 104. On-chip microwave filter 114 receives input signal $S_2$ and reflected signal $S_{R3}$ from subsequent stages in the series of stages. On-chip microwave filter 114 attenuates a different frequency or frequency band from the $(S_2+S_{R3})$ signal to produce signal $S_3$. Operating in this manner, stage 116 (stage n) has on-chip microwave filter 116 configured therewith. On-chip microwave filter 116 receives input signal $S_{n-1}$ (and possibly a reflected signal if q-circuit 110 is configured to reflect any signal frequencies, not shown) from previous stages in the series of stages. On-chip microwave filter 116 filters a different frequency or frequency band from the $(S_{n-1}+$any reflected frequencies) signal to produce signal $S_n$, which forms an input to q-circuit 110.

With reference to FIG. 2A, this figure depicts one example configuration of an on-chip microwave filter in accordance with an illustrative embodiment. The example configuration in this figure of on-chip microwave filter 200 comprises bandpass filter 202. On-chip microwave filter 200 can be implemented as a two-port integrated circuit. Bandpass filter 202 is a dispersive filter to allow a frequency band that is between two threshold frequencies (and filters/blocks frequencies outside this pass band). According to one embodiment, a circuit assembly system forms the bandpass filter component 202 on a chip or printed circuit board.

With reference to FIG. 2B, this figure depicts an example circuit 204 implementing an on-chip microwave filter in accordance with an illustrative embodiment. Component 206 is a dispersive element which implements a bandpass filter to allow a frequency band that is between two threshold frequencies (and filters/blocks frequencies outside this pass band).

Component 206 comprises a configuration of capacitive elements L3 and C3 in parallel and coupled to ground, i.e., the external conductor of the of the on-chip microwave filter. L3-C3 couple to L1-C1 series and L2-C2 series via an internal conductor of the on-chip microwave filter on the other side, as shown. Component 206 also comprises a configuration of capacitive elements L4 and C4 in parallel and coupled to ground, i.e., the external conductor of the on-chip microwave filter. L4-C4 couple to L2-C2 series via an internal conductor of the on-chip microwave filter on the other side, as shown. The depiction of component 206 and elements L1-L4 and C1-C4 are lumped realizations, i.e., a representation of an effective function of component 206 as a bandpass filter in the microwave frequency band. This example shows a simple one-unit-cell, bandpass filter. This design also covers cases in which the simple bandpass filter shown in FIG. 2B is replaced by amore sophisticated bandpass filter that consists of several unit cells and whose attenuation, transmission, bandwidth, cutoff frequency, and ripples characteristics are optimized further or differently.

In component 206, capacitive elements C1 and C2 on the internal conductor of the on-chip microwave filter serves as DC blocks, which can be used to eliminate the formation of ground loops in the fridge. Such ground loops are undesirable as they can generate electronic noise. Inductive element L3 connected the center and external conductors of the on-chip microwave filter offers a path of negligible resistance between the center conductor and the external conductor of the on-chip microwave filter.

The lumped realization of component 206 is not intended to be limiting. From this disclosure, those of ordinary skill in the art will be able to conceive many other implementations for a depicted lumped realization, e.g., using additional or different elements to achieve a similar function of the lumped realization shown here, and such implementations are contemplated within the scope of the illustrative embodiments.

With reference to FIG. 3, this figure depicts an example on-chip microwave filter 300 in accordance with an illustrative embodiment. The example on-chip microwave filter 300 comprises substrate 302, dispersive component including transmission lines 304, 306, 308, connectors 310, 312, and housing 314. Substrate 302 comprises a material with high thermal conductivity (above a threshold) in the cryogenic temperature range. In an embodiment, substrate 302 is formed using a material that exhibits a Residual Resistance Ratio (RRR) of at least 100, and a thermal conductivity of greater than a 1 W/(cm*K) at 4 Kelvin, threshold level of thermal conductivity. RRR is the ratio of the resistivity of a material at room temperature and at 0 K. Because 0 K cannot be reached in practice, an approximation at 4 K is used. For example, substrate 302 may be formed using sapphire, silicon, quartz, gallium arsenide, fused silica, amorphous silicon, or diamond for operations in the temperature range of 77K to 0.01K. These examples of substrate materials are not intended to be limiting. From this disclosure, those of ordinary skill in the art will be able to conceive many other materials suitable for forming the substrate and the same are contemplated within the scope of the illustrative embodiments.

Transmission lines 304, 306, 308 comprise a material with high thermal conductivity (above a threshold) in the cryogenic temperature range. In an embodiment, transmission lines are formed using a metal that exhibits a RRR of at least 100, and a thermal conductivity of greater than a 1 W/(cm*K) at 4 Kelvin, threshold level of thermal conductivity. For example, transmission lines may be formed from using gold, silver, copper, or aluminum. These examples of transmission line materials are not intended to be limiting. From this disclosure, those of ordinary skill in the art will be able to conceive many other materials suitable for forming the substrate and the same are contemplated within the scope of the illustrative embodiments. In an embodiment, transmission lines 304, 306, 308 are thin film depositions on substrate 302. In a non-limiting embodiment, transmission lines have a thickness in a range of about 10 nm-1000 nm. Transmission lines 304, 306, 308 are deposited directly on substrate 302 in an embodiment. For example, transmission lines may be deposited using any conventional physical or chemical thin film deposition process, such as thermal evaporation, chemical vapor deposition, and sputtering.

With reference to FIG. 3, this figure depicts three transmission lines 304, 306, 308 in accordance with an illustrative embodiment. Transmission line 306 is disposed on the substrate between transmission lines 304, 308. Transmission line 306 is spaced apart on the substrate from each of transmission lines 304, 308. Three transmission lines are depicted only as a non-limiting example. In some embodiments, on-chip microwave filter 300 includes two, four, five or more transmission lines.

In an embodiment, transmission lines 304, 306, 308 are configured to attenuate a plurality of frequencies in an input signal. Transmission lines 304, 306, 308 operate as a bandpass filter for the quantum circuit. Alternate configurations of transmission lines can be configured to filter a second plurality of frequencies in an input signal. For example, alternate configurations can be configured to filter an increased/decreased frequency bandwidth of a plurality of frequencies. For example, at least one of a thickness of at least one transmission line, a number of transmission lines, a length of at least one transmission line in the direction of a length of a connector, a width of at least one transmission line, and a material of at least one transmission line can be altered to filter different pluralities of frequencies of an input signal and different bandwidths of a plurality of frequencies of an input signal. In an embodiment, the length of at least one transmission line is increased to filter a second plurality of frequencies lower than a first plurality of frequencies.

Connectors 310, 312 couple to transmission lines 304, 308 at opposite ends of substrate 302, respectively. For example, connectors 310, 312 may be soldered to transmission lines 304, 308, respectively. In a non-limiting embodiment, transmission lines 304, 306, 308 include a minimum width of about 0.5 mm for coupling to the connectors 306, 308. Connectors 310, 312 are specifically configured for usability with signals in the microwave frequency range. In accordance with an illustrative embodiment, connectors 310, 312 are selected to be of the same type and gender. For example, connectors 310, 312 can both be SubMiniature version A (SMA) type connectors of the female type. Using the same type and gender of connectors 310, 312 thus minimizes microwave signal reflection that would otherwise arise from gender conversion adapters.

Connectors 310, 312 comprise a material with high thermal conductivity (above a threshold) in the cryogenic temperature range. In an embodiment, connectors are formed using a metal that exhibits a RRR of at least 100, and a thermal conductivity of greater than a 1 W/(cm*K) at 4 Kelvin, threshold level of thermal conductivity. For example, connectors 310, 312 may be formed using gold, silver, copper, or aluminum. In an embodiment, connectors 310, 312 are single pole connectors. For example, connectors 310, 312 may couple to respective transmission lines 304, 308 at a single contact point.

These examples of the types, genders, and material-combinations of connectors 310, 312 are not intended to be limiting. From this disclosure, those of ordinary skill in the art will be able to conceive many other types, genders, and material-combinations of microwave connectors and the same are contemplated within the scope of the illustrative embodiments. For example, SubMiniature version P (SMP) type connectors, or many other types of microwave and radio frequency connectors, of the same gender, and of a suitable material or material combination, can be formed and used as connectors 310, 312 within the scope of the illustrative embodiments.

Housing 314 comprises a material with high thermal conductivity (above a threshold) in the cryogenic temperature range. For example, housing 314 may be formed using gold, silver, or copper. Housing 314 couples to substrate 302. Housing 314 acts as a heat sink, transferring thermal energy away from the substrate 302 and transmission lines 304, 306, 308, thereby minimizing noise in the transmission lines 304, 306, 308 from the thermal energy. In an embodiment, housing 314 comprises oxygen-free copper material. In an embodiment, housing 314 comprises electrolytic copper material.

Figure 4:
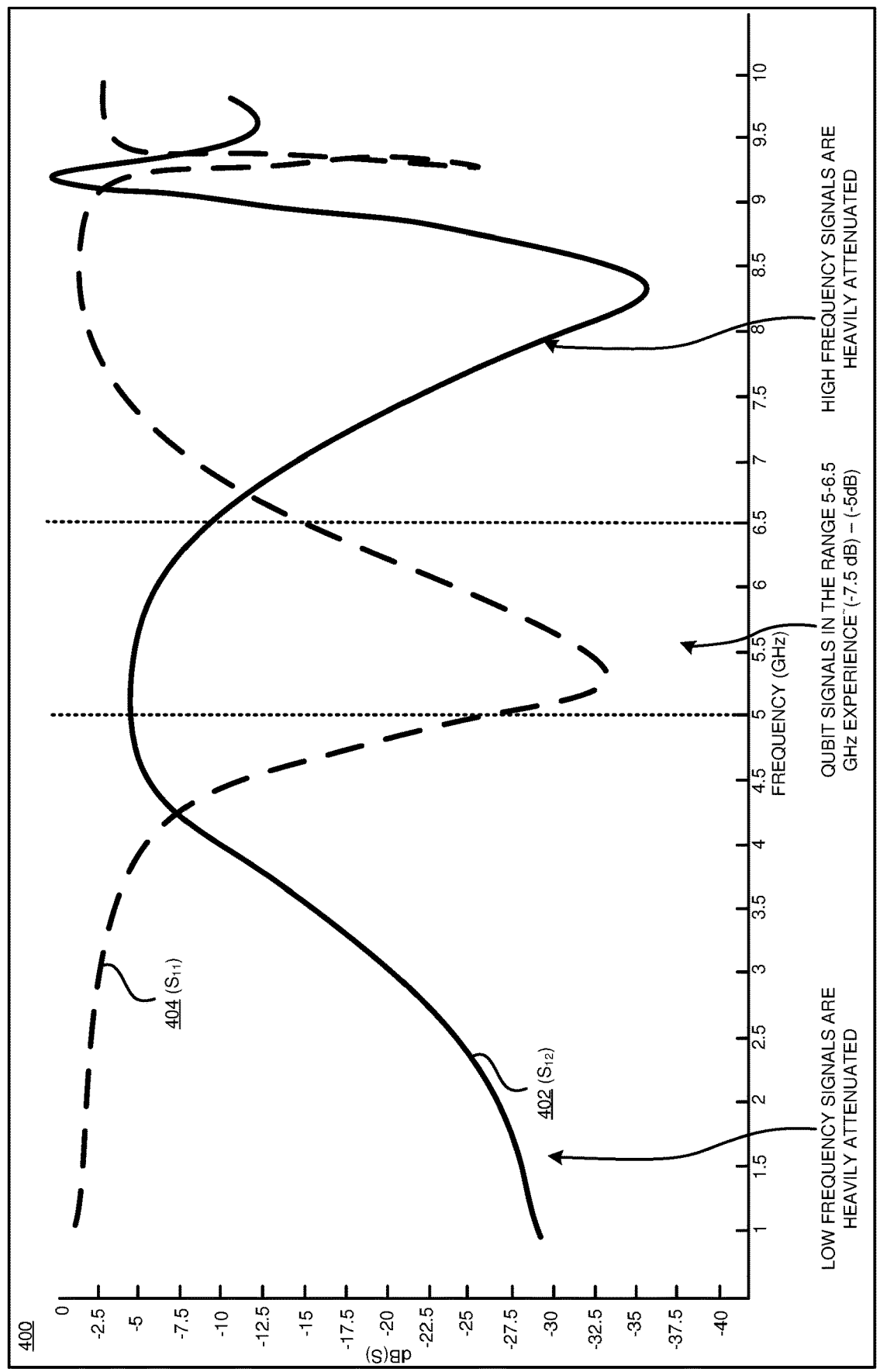
FIG. 4 depicts microwave simulation results of the scattering parameters of an on-chip microwave filter example.

With reference to FIG. 4, this figure depicts microwave simulation results of the scattering parameters of an on-chip microwave filter example. The on-chip microwave filter circuit, whose scattering parameters are shown in FIG. 4, is based on the on-chip microwave filter 300 exhibited in FIG. 3.

In FIG. 4, the graph 402 represents the transmission parameter $S_{12}$, while the graph 404 represents the reflection parameter $S_{11}$. Graph 402 shows significant attenuation for transmitted signals above (e.g., 20 dB around 7.5 GHz) and below (e.g., 20 dB around 3 GHz) the qubit signal range (e.g., 3-5 GHz), while allowing the signals in the qubit signal range to pass moderately filtered (i.e., filtered by about 5-7.5 dB).

Figure 5:
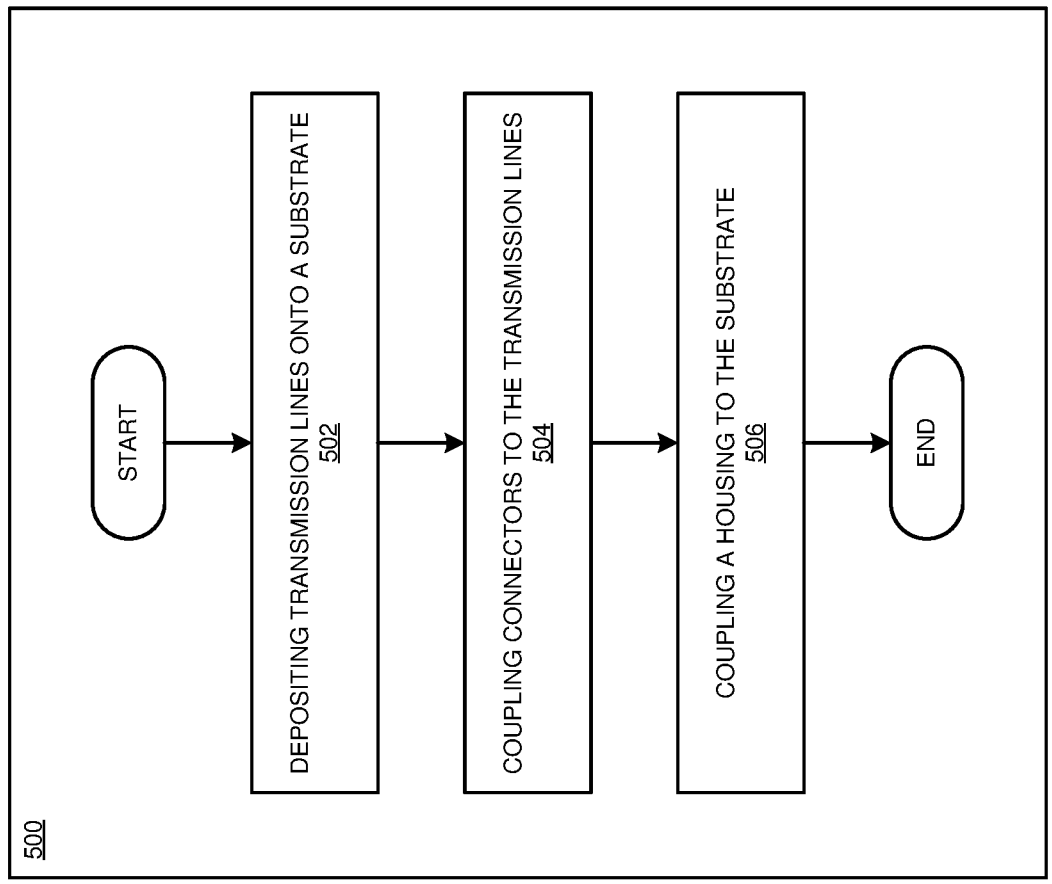
FIG. 5 depicts a flowchart of an example method 500 for assembling an on-chip microwave filter.

With reference to FIG. 5, this figure depicts a flowchart of an example method 500 for assembling an on-chip microwave filter. In block 502, transmission lines are deposited on a substrate. For example, transmission lines may be deposited using any conventional physical or chemical thin film deposition process, such as thermal evaporation, chemical vapor deposition, and sputtering. In an embodiment, at least two transmission lines are deposited onto the substrate. In block 504, connectors are coupled to the transmission lines at respective ends of the substrate. For example, the connectors may be soldered to the transmission lines. In block 506, a housing is coupled to the substrate. For example, the housing may be coupled to the substrate by fasteners, such as screws. In an embodiment, fasteners fabricated from a material that exhibits thermal conductivity above a threshold level of thermal conductivity couple the housing to the substrate.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An on-chip microwave filter circuit comprising:
a substrate formed of a first material that exhibits at least a threshold level of thermal conductivity, wherein the threshold level of thermal conductivity is achieved at a cryogenic temperature range in which a quantum computing circuit operates; and
a dispersive component configured to filter a plurality of frequencies in an input signal, the dispersive component comprising:
a first transmission line disposed on the substrate, the first transmission line being formed of a second material that exhibits at least a second threshold level of thermal conductivity, wherein the first transmission line has a width of about 0.5 mm, wherein the second threshold level of thermal conductivity is achieved at a cryogenic temperature range in which a quantum computing circuit operates; and
a second transmission line disposed on the substrate, the second transmission line being formed of the second material.

2. The circuit of claim 1, further comprising:
a connector coupled to the first transmission line, the connector being formed of a third material that exhibits at least a third threshold level of thermal conductivity, wherein the third threshold level of thermal conductivity is achieved at a cryogenic temperature range in which a quantum computing circuit operates.

3. The circuit of claim 2, further comprising:
a second connector coupled to the second transmission line, the second connector being formed of the third material.

4. The circuit of claim 2, wherein the second material and the third material are the same.

5. The circuit of claim 1, the dispersive component further comprising:
a third transmission line disposed on the substrate, the third transmission line being formed of the second material.

6. The circuit of claim 5, wherein the third transmission line is disposed on the substrate between the first transmission line and the second transmission line.

7. The circuit of claim 5, wherein the third transmission line is spaced apart on the substrate from the first transmission line.

8. The circuit of claim 1, wherein the first transmission line has a thickness of about 10 nm to 1000 nm.

9. The circuit of claim 1, further comprising:
a housing coupled to the substrate, the housing being formed of a fourth material that exhibits at least a fourth threshold level of thermal conductivity, wherein the fourth threshold level of thermal conductivity is achieved at a cryogenic temperature range in which a quantum computing circuit operates.

10. A fabrication system performing operations comprising:
forming a substrate, the substrate being formed of a first material that exhibits at least a threshold level of thermal conductivity, wherein the threshold level of thermal conductivity is achieved at a cryogenic temperature range in which a quantum computing circuit operates; and
forming an on-chip microwave filter on the substrate by assembling a circuit having two ports, the circuit comprising:
a dispersive component to filter a plurality of frequencies in an input signal, the dispersive component comprising:
a first transmission line deposited on the substrate, the first transmission line being formed of a second material that exhibits at least a second threshold level of thermal conductivity, wherein the first transmission line has a width of about 0.5 mm, wherein the second threshold level of thermal conductivity is achieved at a cryogenic temperature range in which a quantum computing circuit operates; and
a second transmission line deposited on the substrate, the second transmission line being formed of the second material.

11. A method comprising:
forming a substrate, the substrate being formed of a first material that exhibits at least a threshold level of thermal conductivity, wherein the threshold level of thermal conductivity is achieved at a cryogenic temperature range in which a quantum computing circuit operates; and
forming an on-chip microwave filter on the substrate by assembling a circuit having two ports, the circuit comprising:
a dispersive component to filter a plurality of frequencies in an input signal, the dispersive component comprising:
a first transmission line deposited on the substrate, the first transmission line being formed of a second material that exhibits at least a second threshold level of thermal conductivity, wherein the first transmission line has a width of about 0.5 mm, wherein the second threshold level of thermal conductivity is achieved at a cryogenic temperature range in which a quantum computing circuit operates; and
a second transmission line deposited on the substrate, the second transmission line being formed of the second material.

12. The method of claim 11, further comprising:
forming a housing, the housing comprising:
a closable structure in which the circuit is positioned, the structure being formed of a third material that exhibits at least a threshold level of thermal conductivity, wherein the threshold level of thermal conductivity is achieved at a cryogenic temperature range in which a quantum computing circuit operates.

13. The method of claim 11, further comprising:
coupling a first connector to the first transmission line, the first connector being formed of a fourth material that exhibits at least a threshold level of thermal conductivity, wherein the threshold level of thermal conductivity is achieved at a cryogenic temperature range in which a quantum computing circuit operates.

14. The method of claim 13, further comprising:
coupling a second connector to the second transmission line, the second connector being formed of the fourth material.

15. The method of claim 13, wherein the fourth material and the second material are the same.

16. The method of claim 11, wherein the dispersive component further comprises:
- a third transmission line being formed of the second material.

17. The method of claim 16, wherein the third transmission line is disposed between the first transmission line and the second transmission line on the substrate.

18. The method of claim 16, wherein the third transmission line is spaced apart on the substrate from the first transmission line.

19. The method of claim 11, wherein the first transmission line has a thickness of about 10 nm to 1000 nm.

* * * * *